United States Patent
Brunnbauer et al.

(10) Patent No.: US 7,674,654 B2
(45) Date of Patent: Mar. 9, 2010

(54) PRODUCING THIN INTEGRATED SEMICONDUCTOR DEVICES

(75) Inventors: Markus Brunnbauer, Lappersdorf (DE); Edward Fuergut, Dasing (DE); Werner Kroeninger, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 257 days.

(21) Appl. No.: 11/756,731

(22) Filed: Jun. 1, 2007

(65) Prior Publication Data

US 2007/0278653 A1 Dec. 6, 2007

(30) Foreign Application Priority Data

Jun. 1, 2006 (DE) .................. 10 2006 025 671

(51) Int. Cl.
*H01L 21/461* (2006.01)
(52) U.S. Cl. ..................... 438/113; 438/464
(58) Field of Classification Search .......... 438/459–465
See application file for complete search history.

(56) References Cited

U.S. PATENT DOCUMENTS

| | | | | |
|---|---|---|---|---|
| 5,516,728 | A * | 5/1996 | Degani et al. ............... | 438/465 |
| 6,398,892 | B1 | 6/2002 | Noguchi et al. | |
| 6,753,238 | B2 * | 6/2004 | Kurita ......................... | 438/459 |
| 2002/0048905 | A1 * | 4/2002 | Ikegami et al. .............. | 438/464 |
| 2004/0110323 | A1 | 6/2004 | Becker et al. | |
| 2008/0242057 | A1 * | 10/2008 | Bauer et al. ................. | 438/464 |
| 2009/0014889 | A1 * | 1/2009 | Barth et al. ................. | 257/777 |
| 2009/0039496 | A1 * | 2/2009 | Beer et al. ................... | 257/693 |

FOREIGN PATENT DOCUMENTS

DE 10065686 7/2002

* cited by examiner

*Primary Examiner*—Savitri Mulpuri
(74) *Attorney, Agent, or Firm*—Edell, Shapiro & Finnan, LLC

(57) ABSTRACT

Thin integrated semiconductor devices are produced by being embedded in a molding compound matrix in such a way that a composite is formed. The semiconductor devices are first embedded in the matrix and then thinned after being embedded. The thin integrated semiconductor devices are singulated by forming separating cuts into the molding compound matrix between adjacent devices.

19 Claims, 6 Drawing Sheets

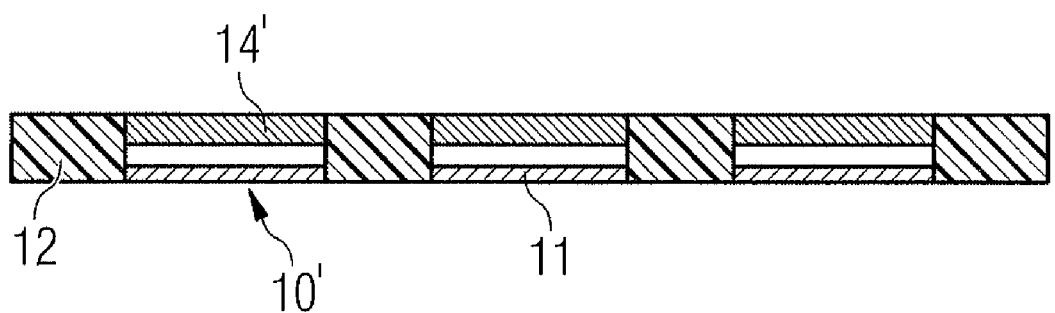
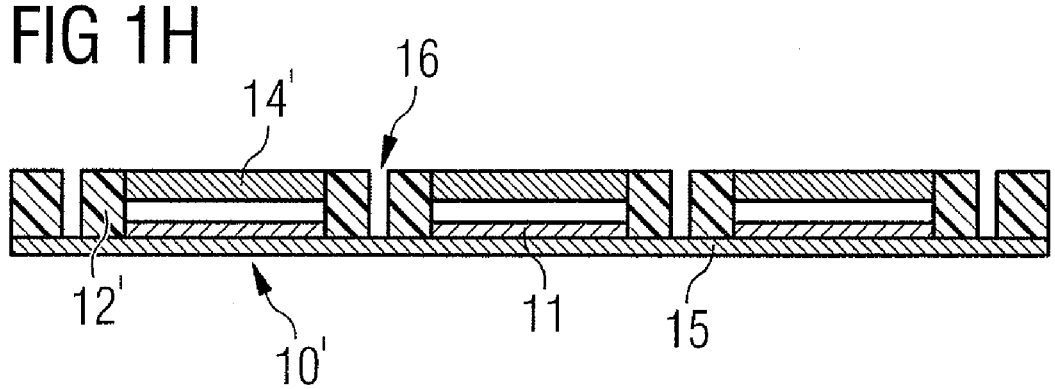
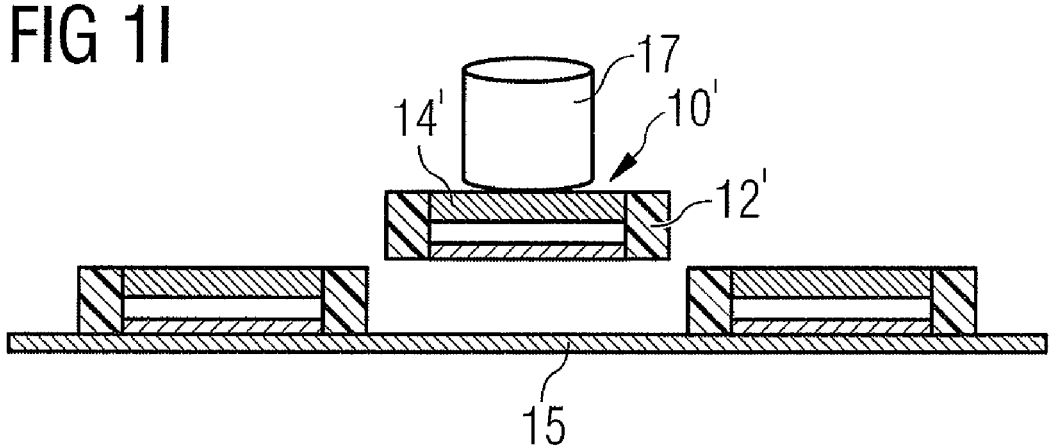

PRODUCING THIN INTEGRATED SEMICONDUCTOR DEVICES

CROSS REFERENCE TO RELATED APPLICATIONS

This application claims priority under 35 U.S.C. §119 to Application No. DE 102006025671.9 filed on Jun. 1, 2006, entitled "Method for Producing Thin Integrated Semiconductor Devices," the entire contents of which are hereby incorporated by reference.

FIELD OF THE INVENTION

The invention relates to producing thin integrated semiconductor chips.

BACKGROUND

Thin semiconductor chips have gained considerable popularity in recent years, for instance in the greatly increasing number of applications for RFID tags. However, thin semiconductor chips have also found wide-ranging applications in power electronics. Since these and future applications are extremely cost-sensitive, there is a considerable need for high-productivity, low-cost production methods.

Thin semiconductor chips which have to undergo certain process steps for back-side processing (for instance those for applications in the area of power electronics) are thinned to the required thickness at wafer level and, after that (also at wafer level), the mentioned back-side process steps are performed, the chips are tested and only then are they singulated.

These known methods are disadvantageous in certain respects. For example, the handling of very thin semiconductor wafers involves special requirements.

SUMMARY

The invention provides an improved method which provides a cost savings in the production of thin semiconductor chips.

Thin semiconductor chips are formed that can be subjected to handling. This is achieved by providing individual chips of a thickness that is adequate for transitory and separate handling. The chips are embedded in a composite matrix and then brought to a desired small thickness.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

BRIEF DESCRIPTION OF THE DRAWINGS

FIGS. 1A to 1I are cross-sectional views of semiconductor chips in a matrix showing the steps of a first embodiment of a method for producing thin chips.

DETAILED DESCRIPTION

Figure 1A:
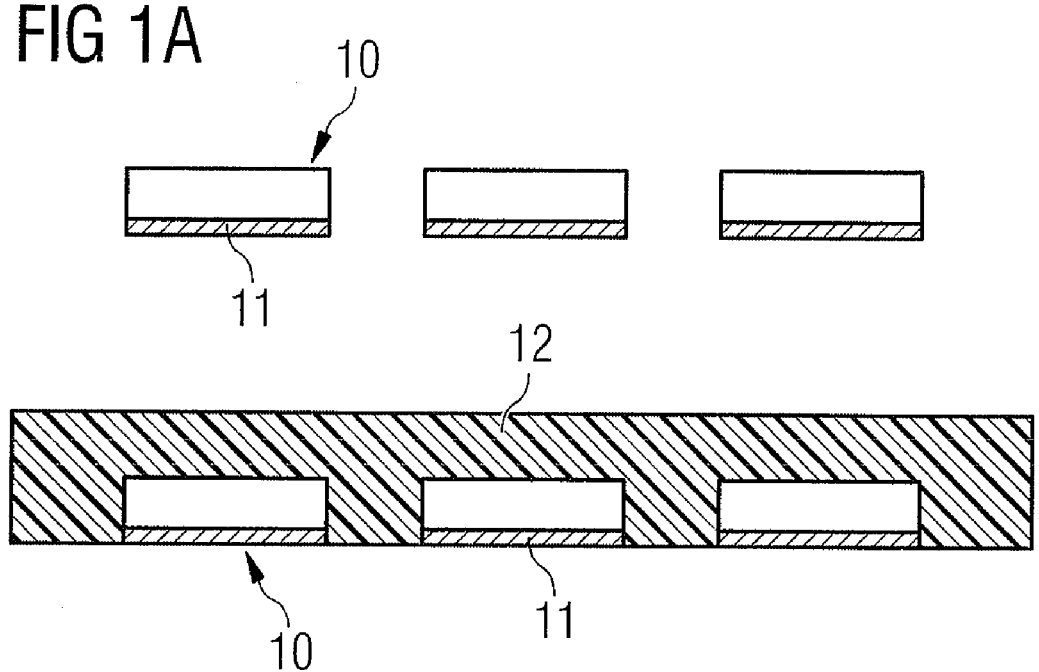

Thin semiconductor chips are formed that can be subjected to handling. This is achieved by providing individual chips of a thickness that is adequate for transitory and separate handling. The chips are embedded in a composite matrix and then brought to a desired small thickness.

The methods described herein render it possible to perform further process steps (after thinning) on the active side (for example testing) and on the back side of the chips (such as for instance back-side metallization or implantation). Since the handling of very thin semiconductor wafers as a whole is hereby avoided, the special technical measures required for this, and the problems observed in the course of these measures, can also be avoided.

The methods are suitable in particular for the production of thin semiconductor arrangements or elements (together referred to here as semiconductor devices) in the range of 100 μm thickness of the semiconductor component or less, in particular of around 50 μm thickness. However, the methods can also be applied to semiconductor devices of greater thickness, insofar as the advantages of the methods are applicable to the handling of whole wafers.

In the methods described herein, the chips are located in a matrix of a molding compound, referred to as an embedded-die wafer-level package.

In a further embodiment, the molding compound matrix with the plurality of embedded thin semiconductor devices is applied to a carrier film before the step of singulating, and the singulating step is performed in such a way that the integrity of the carrier film is preserved. On the still intact carrier film, the singulated chips are provided for further processing, in particular die bonding, and can be removed directly from this film by suitable pickups.

In an exemplary embodiment, the step of providing involves singulating the basic semiconductor devices from a wafer by a bevel cut to create sloping side faces. The fact that the molding compound matrix thereby has webs with sloping side faces allows certain advantages to be achieved in respect of later back-side processes, for instance when applying a preparational layer for back-side metallization.

It is also advantageous to provide the basic semiconductor devices with a front-side metallization.

The step of thinning can be performed by grinding away the entire handling arrangement over the full surface area, that is to say the molding compound matrix together with the embedded chips with the original thickness. The parameters of the grinding process are to be adapted here to the physical peculiarities of the molding compound/chip composite. Alternatively, the thinning can include selective wet and/or dry etching of the back sides of the basic semiconductor devices. The etching processes to be used here are known in the art.

The embedded thin semiconductor devices may be provided with a back-side metallization after the thinning step. In particular, the forming of the back-side metallization can include the application of a seed layer over the full surface area, in particular by a sputtering method. Other preparational steps may also be used, and they are respectively followed with preference by an electroless deposition of metal, for instance a Ni or Au layer.

Photoresist masking of the molding compound matrix may be performed before or after the application of the seed layer to prevent metal from being deposited on the matrix, where a photoresist pattern that is applied later can be removed again.

If the thickness of the provided metal layer is not exactly set from the outset in the case of the chosen process of back-side metallization, the metal coating is followed by back-thinning by a CMP method, which is known in the art.

The subsequent singulating of the finished semiconductor devices can be achieved by mechanical dicing (for example sawing) of the handling composite, it being necessary to adjust the processing parameters to match the mechanical properties of the same, in particular of the molding compound matrix. Alternatively, the singulating may be performed by laser cutting, likewise with parameters adjusted to match the mechanical properties of the molding compound matrix.

Even before the singulating, the finished semiconductor devices can be tested and/or contacted. This allows further handling advantages to be achieved over measuring and contacting of already singulated thin chips.

It is preferred for the embedding in the molding compound matrix to be performed from the outset in such a way that functionally packaged thin integrated semiconductor devices are obtained in the singulating step. In addition, the singulated thin integrated semiconductor devices may be additionally enclosed in a package. As an alternative to this, complete packaging of the thin semiconductor devices can be performed in an additional step, where the originally provided (thick) semiconductor chips are embedded in molding compound.

Exemplary embodiments of the invention are now described with reference to the figures.

Figure 1B:
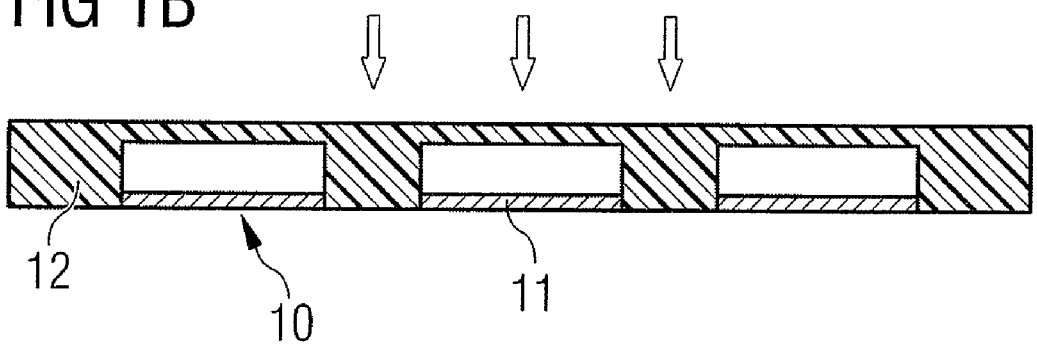

In FIG. 1A, a plurality of thick semiconductor chips 10 with a front-side metal layer (metallization on the active side) 11 are embedded at predetermined intervals from one another in a molding compound matrix 12. A known technique for producing what is known as a universal package can be used. The chips are embedded as shown in FIG. 1A, such that the front-side metal layer 11 of each chip 10 is generally flush or coplanar with the front side of the matrix 12. In FIG. 1B, the semiconductor chips 10 are embedded in the molding compound matrix 12, and a certain thickness is removed from the matrix by a grinding method adjusted to match the mechanical properties of the molding compound. In the process, a thin layer thickness of the molding compound 12 may remain over the back side of the embedded semiconductor chips (i.e., the side of each chip that opposes the active side with metal layer 11), as can be seen in the lower part of the figure.

Figure 1C:
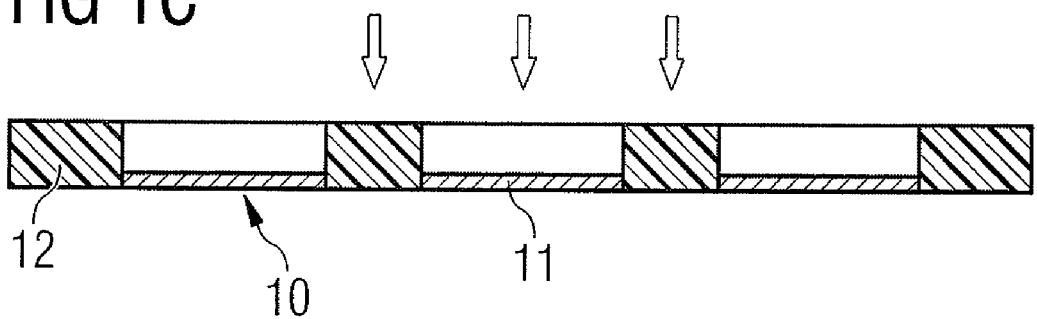
Figure 1D:
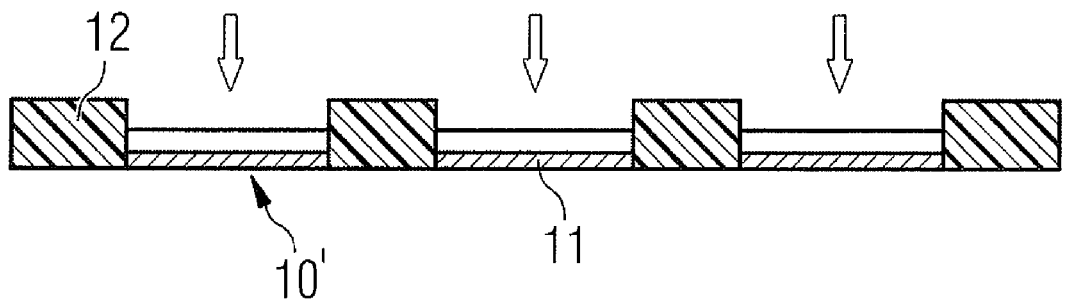

FIG. 1C schematically shows the first phase of a further grinding process, to which the matrix and the embedded semiconductor chips (e.g., the plastic and the silicon) are grinded using processing parameters adjusted in a suitable manner to match the two materials, such that the back sides of the semiconductor chips are exposed due to the grinding away of the matrix material. As shown in FIG. 1D, each of the back sides of the embedded semiconductor devices 10 is thinned to its target thickness by suitable etching steps (dry etching, wet etching, plasma etching, KOH treatment or the like) so as to obtain thin semiconductor chips 10'. In FIGS. 1C and 1D, the removal of matrix material and thinning of the chips can be achieved by mechanical grinding, chemical removal or any combination of physical/chemical removal.

Figure 1E:
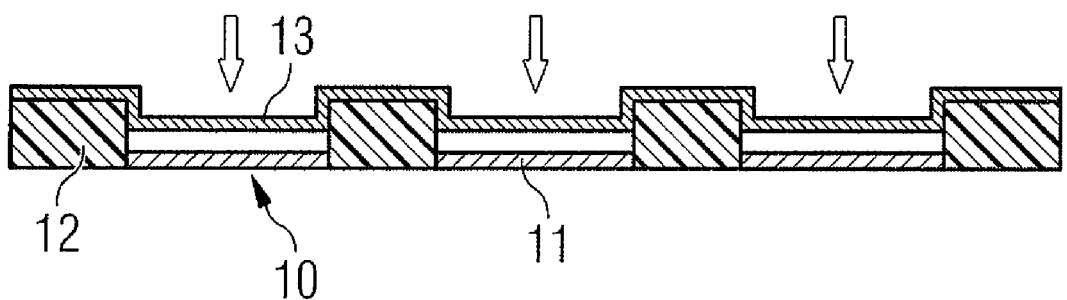
Figure 1F:
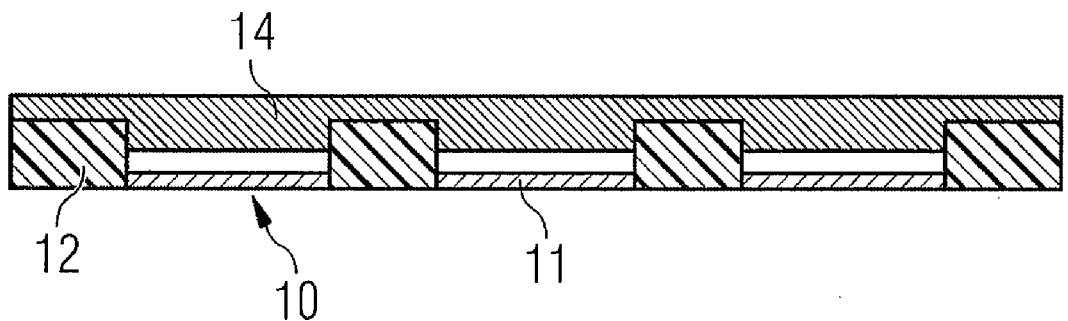

A seed layer 13 is formed on the back side of the molding compound matrix 12 with the embedded thin semiconductor chips 10'. In FIG. 1E, the application of a seed layer, for instance by a sputtering method, on the back side of the thin semiconductor chip 10' and the composite matrix 12 is shown. FIG. 1F then shows the composite after back-side metallization of the entire handling composite over the full surface area, for instance by electroless metal deposition, so as to form a relatively thick back-side metal layer 14.

FIG. 1G shows the resultant structure or composite after a back-thinning step, where the metal layer over the matrix regions is removed again and only a metal layer 14' on the back side of the thin semiconductor chips 10' remains.

In FIG. 1H, a carrier film 15 has been applied to the front side of the composite comprising the molding compound matrix 12 and the thin semiconductor chips 10'. Separating cuts 16 are formed into the molding compound matrix, so as to singulate the composite into individual packages 12' of the thin semiconductor chips 10'. The separating cuts 16 are introduced by a mechanical or laser-optical separating tool in such a way that the integrity of the carrier film 15 is preserved for further handling.

Finally, FIG. 1I symbolizes how one of the thin semiconductor chips 10' with the associated package 12' is removed by a suitable pickup 17 from the carrier film 15, for instance for subsequent die bonding.

An alternative method is described with respect to FIGS. 2A to 2I, where most of the process steps coincide with the method described above and depicted in FIGS. 1A to 1I. Accordingly, similar reference numerals akin are provided in FIGS. 2A to 2I which correspond with reference numerals in FIGS. 2A to 2I (e.g., the semiconductor chips 20 and 20 and front-side metal layer 21 of FIGS. 2A to 2I correspond with the semiconductor chips 10 and front-side metal layer 11 of FIGS. 1A to 1I), and the description of the corresponding parts or steps is not repeated here.

Figure 2A:
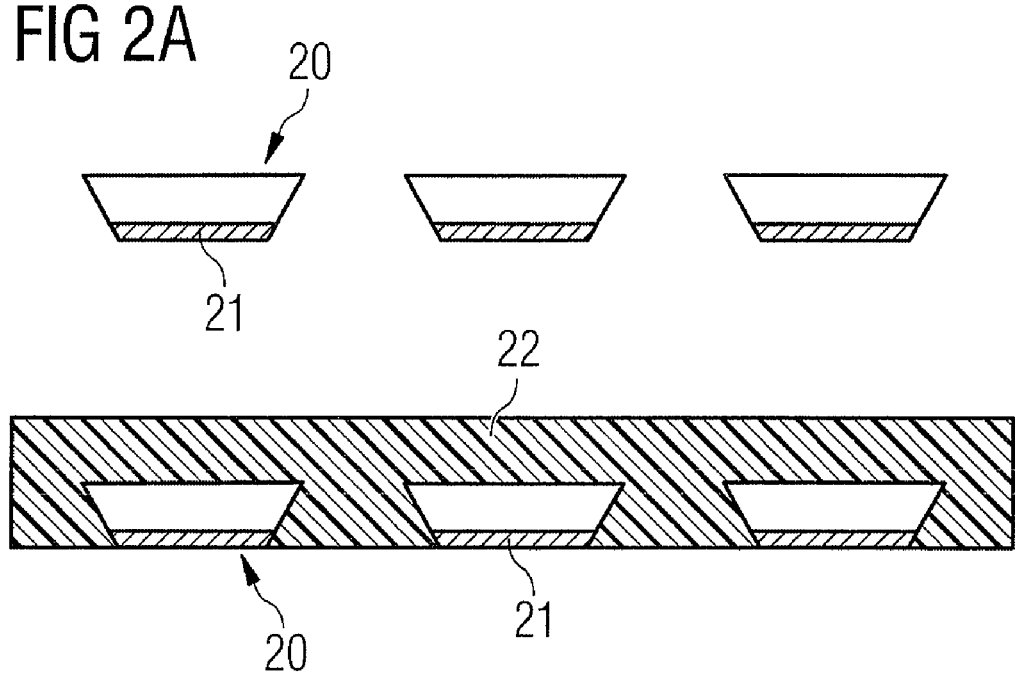
FIGS. 2A to 2I are cross-sectional views of semiconductor chips in a matrix showing the steps of a first embodiment of a method for producing thin chips.
Figure 2B:
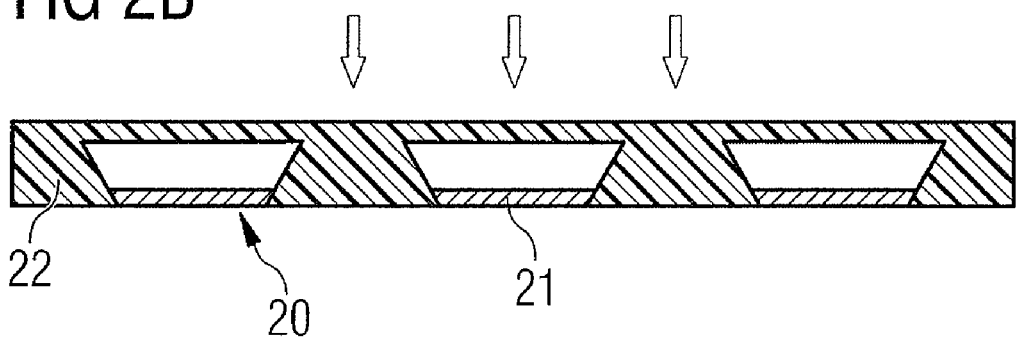
Figure 2C:
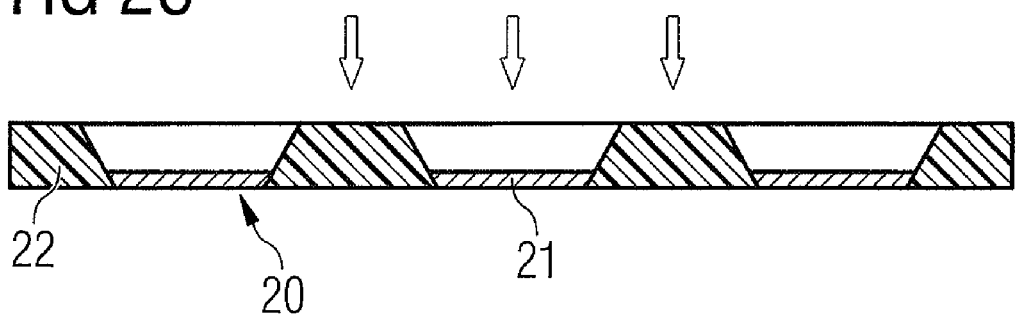
Figure 2D:
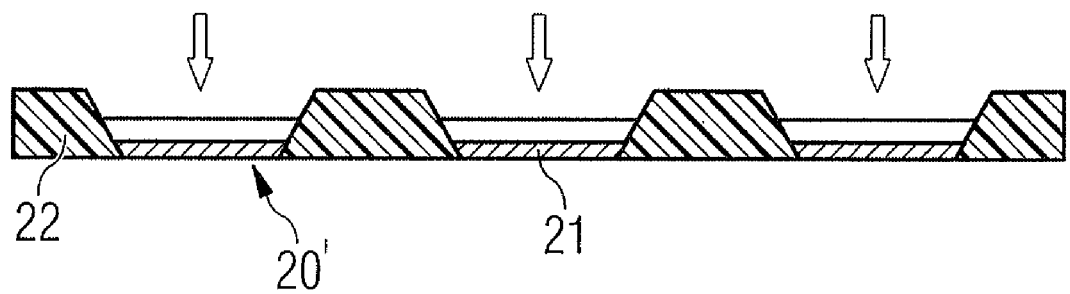
Figure 2E:
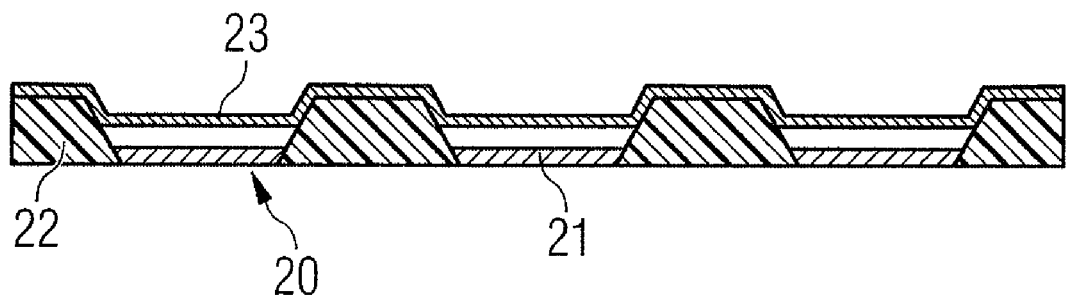
Figure 2F:
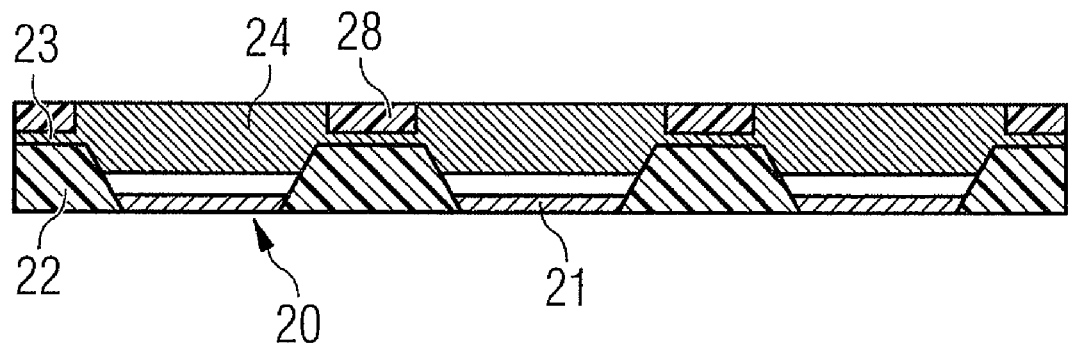

One difference between the two embodiments is that each of the "thick" semiconductor chips 20 is provided with side faces or sides that are non-parallel with respect to each other and slope between the front side and the back side of the chip, the sloped sides being formed with a bevel cut. The sloped sides for the chips 20 facilitate easier back-side metallization, particularly when creating a seed layer by sputtering (as shown in FIG. 2E). While the semiconductor chips 20 are represented with a front-side metallization 21, this feature is optional. This feature is also optional for the embodiment of FIGS. 1A to 1I.

In addition, before the step of growing a thick metal layer on the preparatory seed layer (numeral 23 in FIG. 2E), a photoresist structure 28 corresponding to the structure of the molding compound matrix 22 is applied to the seed layer by a conventional photolithographic method. This structured photoresist layer 28 prevents deposition of metal on the back side of the molding compound matrix 22.

Figure 2G:
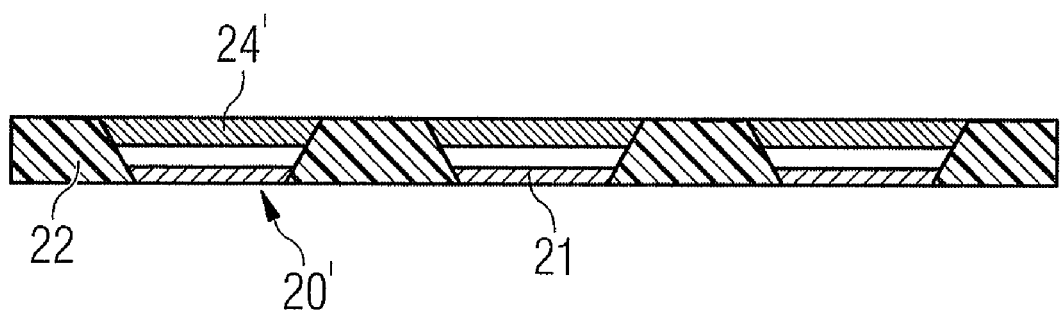
Figure 2H:
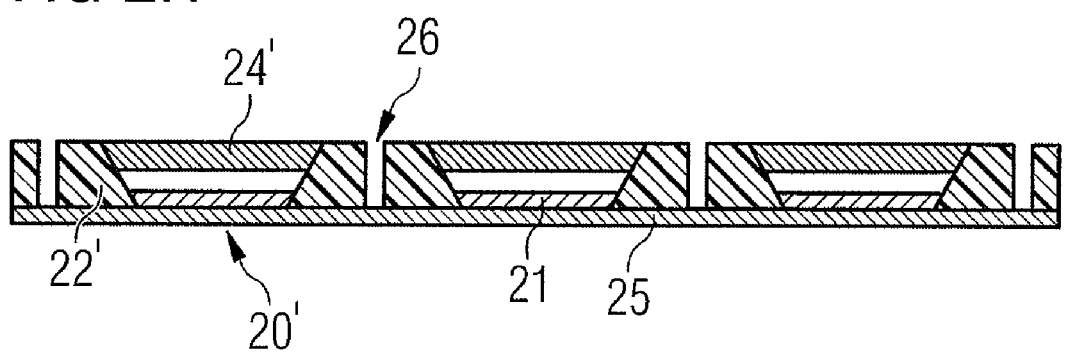
Figure 2I:
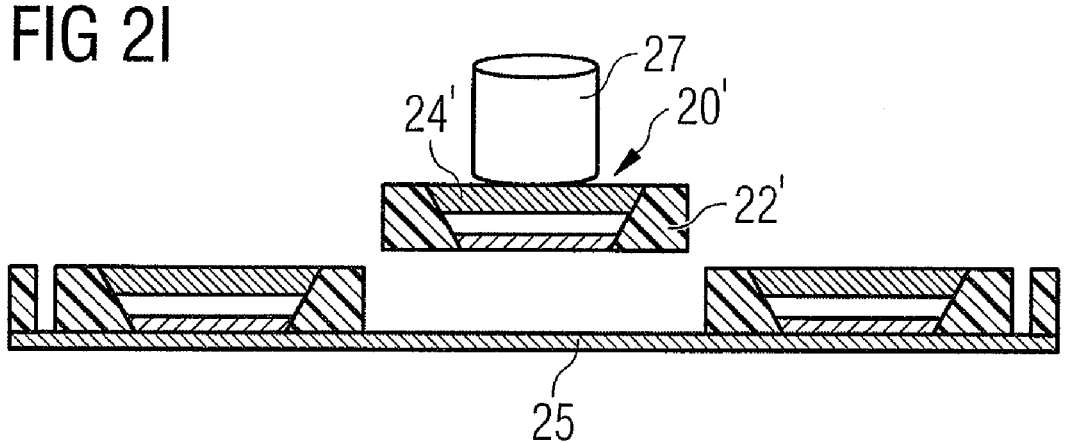

Although thinning of the back-side metallization is also shown in FIG. 2G, when the method is conducted in this manner it is also possible in principle to dispense with this step.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed:

1. A method for producing thin devices having a thickness of no greater than 100 μm, the method comprising:

embedding a plurality of devices within a molding compound matrix to form a composite including the devices;

thinning the embedded devices to a desired thickness, wherein the thinning includes a reduction in a thickness across an entire surface area of a backside of each embedded device, wherein the embedded devices are thinned to a thickness than is less than a thickness of molding compound matrix such that the back side of each embedded device is recessed within the molding compound matrix a selected distance from a back side of the molding compound matrix; and singulating the embedded and thinned devices by providing separating cuts in the molding compound matrix between adjacent devices.

2. The method of claim 1, wherein the thin devices are integrated semiconductor devices.

3. The method of claim 1, further comprising:
applying a carrier film to a side of the composite before singulating the embedded and thinned devices, wherein the separating cuts in the singulating of the embedded and thinned devices do not extend through the carrier film.

4. The method of claim 1, wherein each embedded device includes opposing sides that are formed by a bevel cut such that the opposing sides are non-parallel with respect to each other.

5. The method of claim 1, wherein each of the embedded devices includes a front side with a metal layer disposed on the front side.

6. A method for producing thin devices having a thickness of no greater than 100 µm, the method comprising:
embedding a plurality of devices within a molding compound matrix to form a composite including the devices;
thinning the embedded devices to a desired thickness; and
singulating the embedded and thinned devices by providing separating cuts in the molding compound matrix between adjacent devices;
wherein each of the embedded devices includes a front side with a metal layer disposed on the front side, and the metal layer on the front side of each embedded device is coplanar with a corresponding front side of the molding compound matrix.

7. The method of claim 1, wherein the step of thinning comprises grinding a side of the molding compound matrix with the embedded devices over the entire surface area of the side.

8. The method of claim 1, wherein the step of thinning comprises performing a selective wet and/or dry etching of back sides of the embedded devices, wherein front sides of the embedded devices which oppose the back sides are coplanar with a corresponding front side of the molding compound matrix.

9. The method of claim 8, wherein the embedded and thinned devices are provided with a metal layer on the back sides after the thinning step.

10. A method for producing thin devices having a thickness of no greater than 100 µm, the method comprising:
embedded a plurality of devices within a molding compound matrix to form a composite including the devices;
thinning the embedded devices to a desired thickness, wherein the step of thinning comprises performing a selected wet and/or dry etching of back sides of the embedded devices, and front sides of the embedded devices which oppose the back sides are coplanar with a corresponding front side of the molding compound matrix;
singulating the embedded and thinned devices by providing separating cuts in the molding compound matrix between adjacent devices; and
providing the embedded and thinned devices with a metal layer on the back sides after the thinning step, including the step of applying a seed layer over the surface areas of the back sides of the embedded and thinned devices and also a corresponding back side of the molding compound matrix.

11. The method of claim 10, wherein the seed layer is applied by a sputtering process or vacuum deposition process.

12. The method of claim 10, wherein the providing of the back sides of the embedded and thinned devices with a metal layer further comprises performing an electroless deposition of metal over the seed layer.

13. The method of claim 12, wherein the metal deposited over the seed layer comprises a nickel layer or a gold layer.

14. The method of claim 10, wherein the providing of the back sides of the embedded and thinned devices with a metal layer further comprises providing a photoresist mask over portions of the molding compound matrix before or after the application of the seed layer, wherein the photoresist mask prevents metal from being deposited on portions of the molding compound matrix.

15. The method as claimed in claim 9, further comprising:
thinning the metal layer applied on the back sides to a selected thickness.

16. The method of claim 1, wherein the singulating step comprises sawing sections of the molding compound matrix between adjacent devices.

17. The method of claim 1, wherein the singulating step comprises laser cutting sections of the molding compound matrix between adjacent devices.

18. The method of claim 2, further comprising:
performing a test of the thin integrated semiconductor devices embedded in the molding compound matrix.

19. The method of claim 2, wherein the singulating of the embedded and thinned devices yields individually packaged thin integrated semiconductor devices.

* * * * *